United States Patent
Yeh et al.

(10) Patent No.: US 7,596,000 B2
(45) Date of Patent: Sep. 29, 2009

(54) SIGNAL TRANSMITTING APPARATUS USING FLEXIBLE FLAT CABLE FOR AN OPTICAL DISC DRIVE

(75) Inventors: Shih-Lin Yeh, Hsinchu (TW); Jung-Fu Chen, Hsinchu (TW); Min-Cheng Yang, Hsinchu (TW)

(73) Assignee: Lite-On It Corp., Taipei (TW)

( * ) Notice: Subject to any disclaimer, the term of this patent is extended or adjusted under 35 U.S.C. 154(b) by 481 days.

(21) Appl. No.: 11/461,210

(22) Filed: Jul. 31, 2006

(65) Prior Publication Data

US 2007/0042623 A1 Feb. 22, 2007

(30) Foreign Application Priority Data

Aug. 19, 2005 (TW) .............................. 94128500 A

(51) Int. Cl.
*H05K 7/14* (2006.01)
(52) U.S. Cl. .................. 361/799; 361/749; 361/750; 361/751; 361/752; 361/753; 361/803; 174/254
(58) Field of Classification Search ............... 361/776, 361/772, 760, 748, 749, 750, 751, 752, 753, 361/792, 796, 799, 800, 803; 174/250, 251, 174/254, 259, 263, 260, 261, 257; 439/164
See application file for complete search history.

(56) References Cited

U.S. PATENT DOCUMENTS 4,095,262 A * 6/1978 St. Clair .......................... 361/1
5,342,210 A * 8/1994 Trine et al. ...................... 439/95
2002/0081874 A1* 6/2002 Kumamoto et al. ........... 439/87
2003/0085054 A1* 5/2003 Ames et al. .................. 174/254
2004/0205785 A1* 10/2004 Takahashi et al. ........... 720/601
2005/0111175 A1* 5/2005 Kim ............................ 361/681
2008/0062658 A1* 3/2008 Oowaki ....................... 361/749
2009/0000809 A1* 1/2009 Yagisawa et al. ............ 174/254
2009/0008131 A1* 1/2009 Shibata et al. ............... 174/254

\* cited by examiner

*Primary Examiner*—Dean A. Reichard
*Assistant Examiner*—Hoa C Nguyen
(74) *Attorney, Agent, or Firm*—Kirton & McConkie; Evan R. Witt

(57) ABSTRACT

The disclosure relates to a signal transmitting apparatus. The signal transmitting apparatus includes a conductor, a first and a second circuit boards, and a signal transmitting medium that is electrically interconnected between the first circuit board and the second circuit board. The signal transmitting medium includes a ground wire and an insulating layer wrapping the ground wire, wherein at least an end portion of the ground wire is not wrapped by the insulating layer and is bent to overlap the insulating layer and electrically connected to the conductor via a conductive adhesive material so as to conduct the electrostatic charges accumulated in the signal transmitting medium to the conductor as a ground.

7 Claims, 5 Drawing Sheets

SIGNAL TRANSMITTING APPARATUS USING FLEXIBLE FLAT CABLE FOR AN OPTICAL DISC DRIVE

FIELD OF THE INVENTION

The present invention relates to a signal transmitting apparatus, and more particularly to a signal transmitting apparatus using a flexible flat cable as a signal transmitting medium for an optical disc drive.

BACKGROUND OF THE INVENTION

Recently, the general trends in designing optical disc drives are toward small size, light weight and easy portability. In comparison with the half-height optical disc drive conventionally used in the desktop computers, the slim-type optical disc drive is widely used in notebook computers due to the reduced volume and its light weight.

Referring to FIG. 1, a typical slim-type optical disc drive 1 is shown. The slim-type optical disc drive 1 comprises a casing 10, a disc tray 12 and an optical pickup head 11 integrated into the disc tray 12. After an optical disc 16 is positioned in the disc tray 12, the disc tray 12 is pushed into the casing 10 for further reading operations. The slim-type optical disc drive 1 further comprises a signal transmitting apparatus 5 comprising a controlling circuit board 15, an operating circuit board 14 and a signal transmitting medium 13.

Typically, in the slim-type optical disc drive 1, a flexible printed circuit (FPC) 13 is used as a common signal transmitting medium 13 to make electrical connection between the operating circuit board 14 integrated within the disc tray 12 and the controlling circuit board 15 mounted within the casing 10. The flexible printed circuit 13 is easily bent and stretched in a narrow and crowded space. In addition, the properties of the flexible printed circuit 13 are low operating voltage, low power consumption, light weight and minimized electrostatic interference. Due to these special characteristics, the flexible printed circuit 13 is very widely used, for example, in the slim-type optical disc drives, digital cameras, printers, mobile phones, liquid crystal displays, MPEG Layer 3 (MP3) players, etc. However, the use of flexible printed circuit 13 is not cost effective because the flexible printed circuit 13 needs to be designed in a unique circuit. Therefore the cost of optical disc drive is increased.

For a purpose of reducing the manufacturing cost of the optical disc drive, a flexible flat cable (FFC) is used as the signal transmitting medium for the signal transmitting apparatus in the optical disc drive in replace of the conventional flexible printed circuit (FPC), as is described in, for example, US Patent Application No. 2004/0205785 A1.

Although the flexible flat cable (FFC) is cost effective, there are still some drawbacks. For example, electrostatic discharge (ESD) and electromagnetic interference (EMI) are readily generated in the flexible flat cable (FFC) during signal transmission. As known, ESD and EMI are detrimental to the electronic components of the optical disc drive.

Therefore the present invention is to provide a signal transmitting apparatus using a flexible flat cable (FFC) to overcome the drawbacks of the flexible flat cable (FFC) mentioned above.

SUMMARY OF THE INVENTION

The present invention provides a signal transmitting apparatus using a flexible flat cable as a signal transmitting medium, in which electrostatic discharge (ESD) and electromagnetic interference (EMI) generated during signal transmission are effectively minimized.

The present invention relates to a signal transmitting apparatus including a conductor, a first and a second circuit boards, and a signal transmitting medium electrically interconnected between the first circuit board and the second circuit board. The signal transmitting medium further includes a ground wire and an insulating layer wrapping the ground wire, wherein at least an end portion of the ground wire is not wrapped by the insulating layer and is bent to overlap the insulating layer and electrically connected to the conductor via a conductive adhesive material so as to conduct away the electrostatic charges accumulated in the signal transmitting medium.

The present invention further relates to a signal transmitting apparatus including a conductor, a first and second circuit board, and a signal transmitting medium electrically interconnected between the first circuit board and the second circuit board. The signal transmitting medium further includes a ground wire and an insulating layer wrapping the ground wire, wherein a bare portion of the ground wire located between two ends of the signal transmitting medium is not wrapped by the insulating layer, and the bare portion of the ground wire is electrically connected to the conductor via a conductive adhesive material so as to conduct away the electrostatic charges accumulated in the signal transmitting medium.

BRIEF DESCRIPTION OF THE DRAWINGS

The above contents of the present invention will become more readily apparent to those ordinarily skilled in the art after reviewing the following detailed description and accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
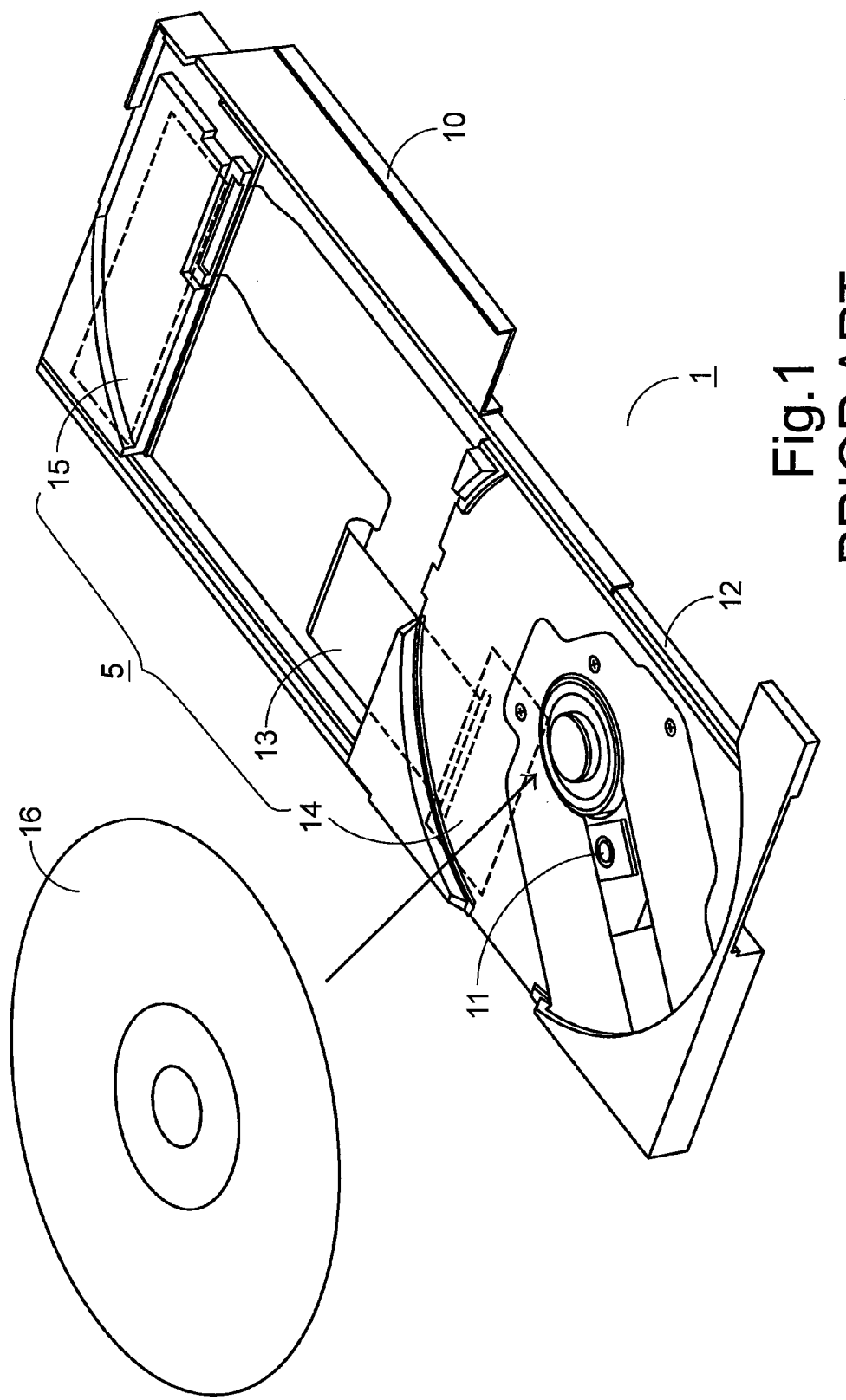
FIG. 1 is a schematic perspective view of a conventional slim-type optical disc drive.
Figure 2:
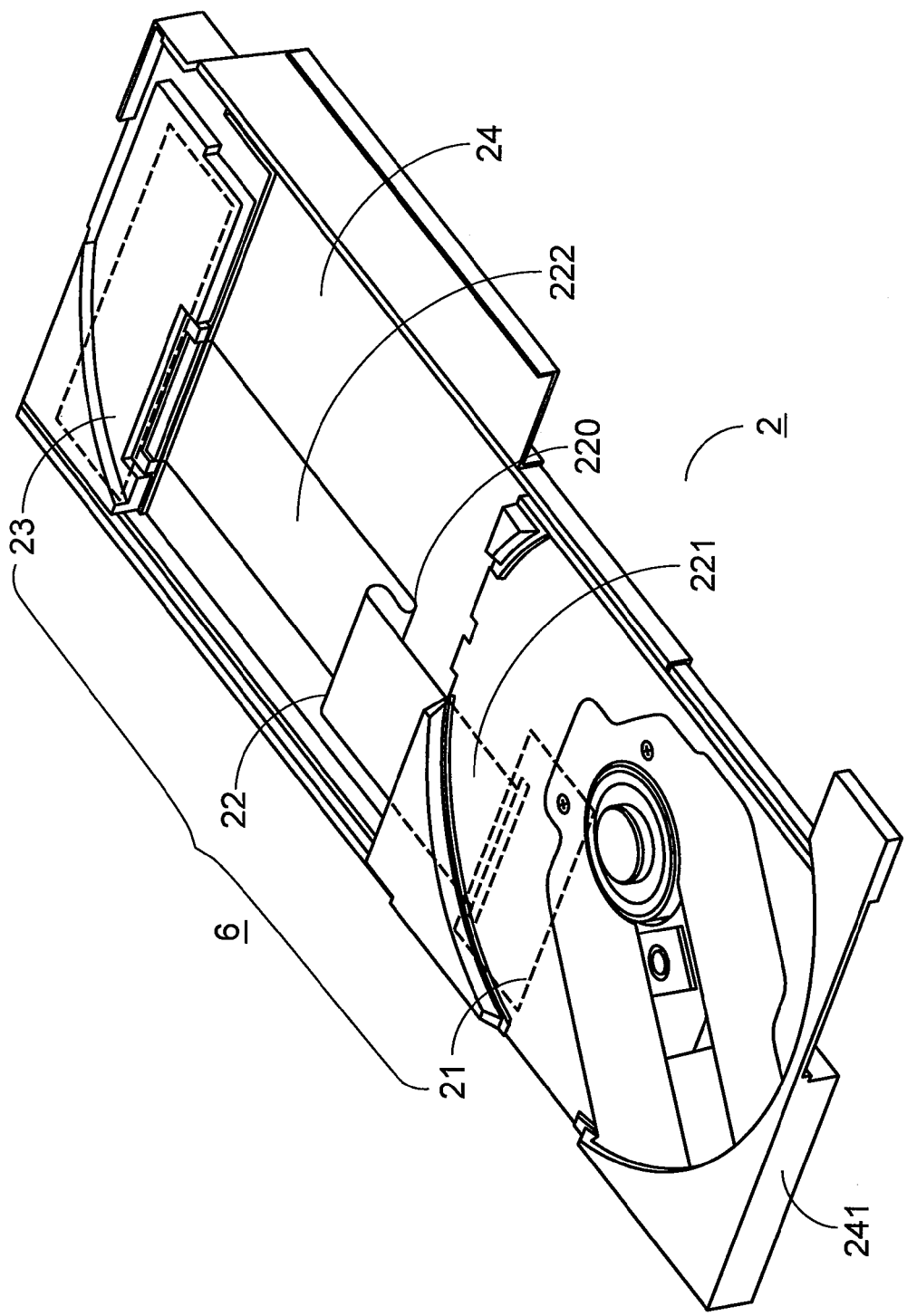
FIG. 2 is a schematic perspective view of a signal transmitting apparatus applied in a slim-type optical disc drive according to the present invention.

Referring to FIG. 2, a slim-type optical disc drive 2 according to a preferred embodiment of the present invention is shown. The slim-type optical disc drive 2 comprises a disc tray 241 and a signal transmitting apparatus 6. The signal transmitting apparatus 6 further comprises a first circuit board 21, a signal transmitting medium 22, a second circuit board 23 and a conductor 24 as a ground. In the preferred embodiment, the signal transmitting medium 22 is a flexible flat cable (FFC) 22 and the conductor 24 is a casing 24. The first circuit board 21 is mounted within the disc tray 241 and the second circuit board 23 is mounted within the casing 24. The flexible flat cable (FFC) 22 is electrically interconnected between the first circuit board 21 and the second circuit board 23. After an optical disc (not shown) is positioned in the disc tray 241, the disc tray 241 is pushed into the casing 24 for further reading operations.

The flexible flat cable (FFC) 22 is bent around a bending line 220 which is located between two ends of the flexible flat cable 22. With the bending line 220, the flexible flat cable 22 is divided into a first portion 221 and a second portion 222 adjacent to the first circuit board 21 and the second circuit board 23, respectively. Since the flexible flat cable 22 is made of light and flexible material, the first portion 221 is moved with the disc tray 241. The flexible flat cable 22 of the present invention is distinguished by an electrostatic elimination structure, as will be illustrated as follows in great details.

Figure 3A:
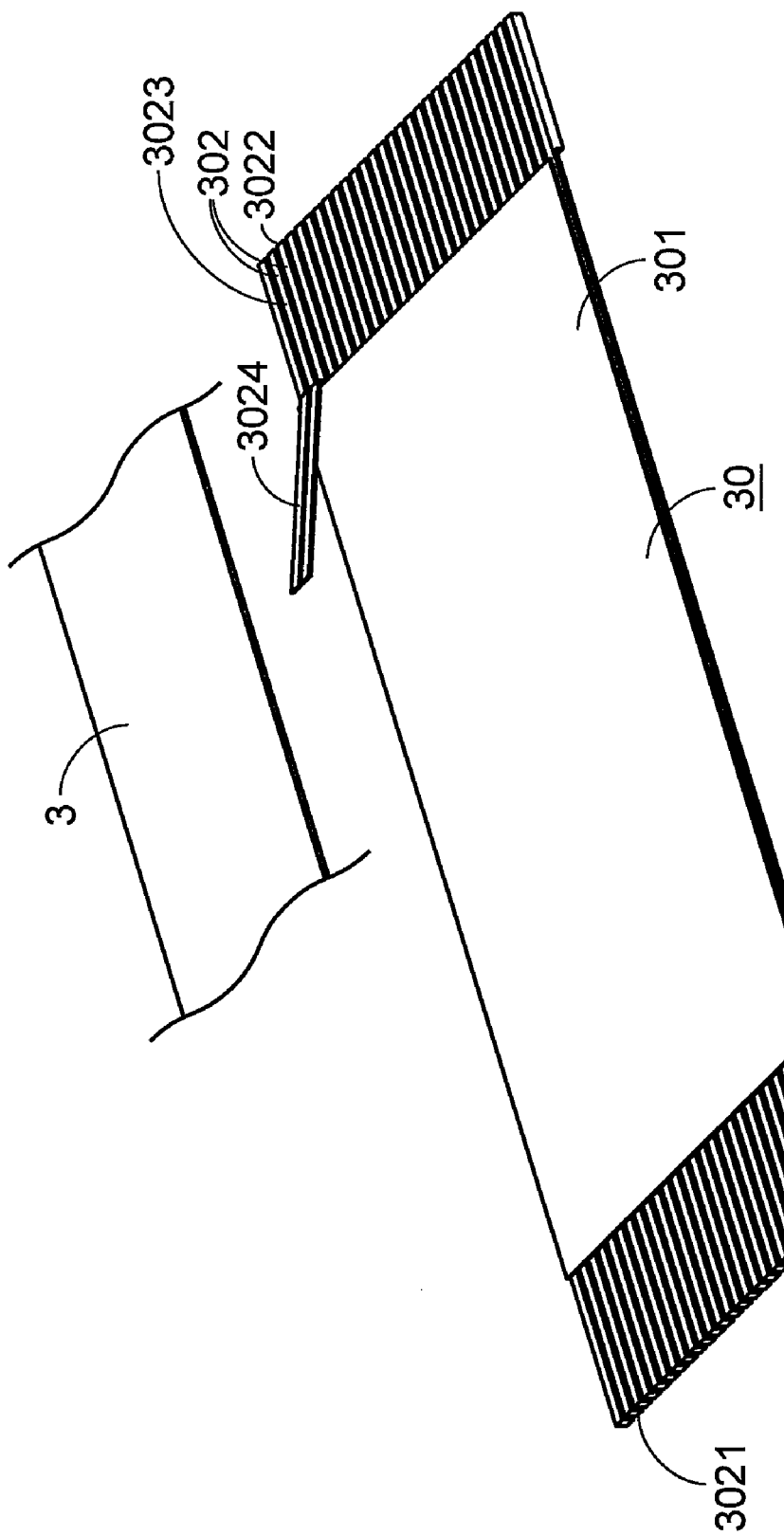
FIG. 3(a) is a schematic perspective view of a flexible flat cable according to a preferred embodiment of the present invention.
Figure 3B:
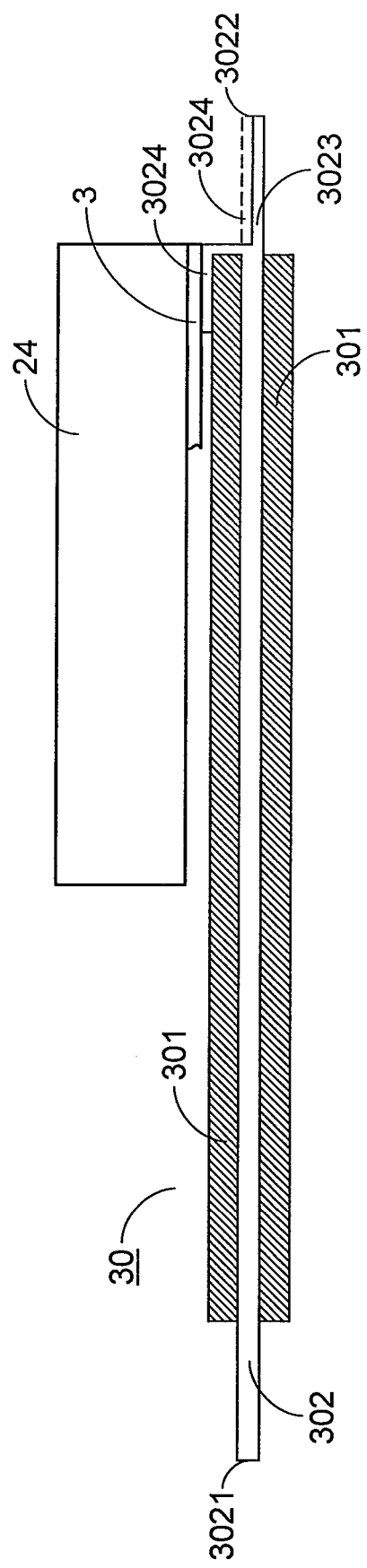
FIG. 3(b) is a schematic cross-sectional view of the flexible flat cable in FIG. 3(a)

Please refer to FIGS. 3(a) and 3(b), which respectively shows a perspective view of a flexible flat cable 30 according to a preferred embodiment of the present invention and a cross-section view thereof. The flexible flat cable 30 includes a ground wire 302, and an insulating layer 301 wrapping the ground wire 302. The ground wire 302 has a first end portion 3021 and a second end portion 3022 which are not wrapped by the insulating layer 301 as shown in FIG. 3(a). The first end portion 3021 of the ground wire 302 is electrically connected to the first circuit board 21 as shown in FIG. 2. The second end portion 3022 of the ground wire 302 is separated into a first conducting layer 3023 and a second conducting layer 3024. The first conducting layer 3023 of the second end portion 3022 is electrically connected to the second circuit board 23 as shown in FIG. 2. The second conducting layer 3024 of the second end portion 3022 is bent to overlap the top surface of the insulating layer 301 as shown in FIG. 3(b). Via a conductive adhesive material 3, the second conducting layer 3024 is bonded to a proper location of the casing 24. Since the ground wire 302 is electrically connected to the casing 24 by the second conducting layer 3024 of the second end portion 3022, electrostatic charges accumulated in the flexible flat cable 30 will be effectively conducted to the casing 24 as a ground.

Figure 4:
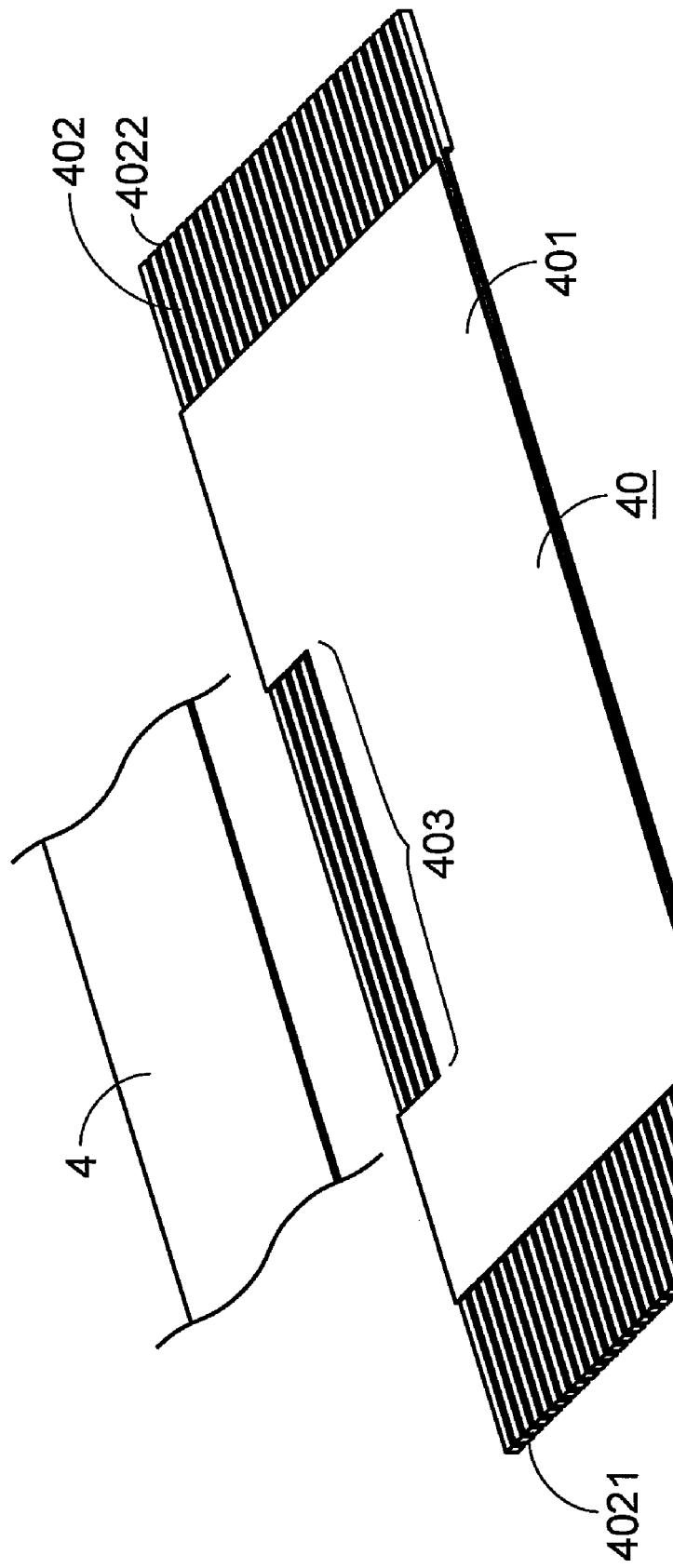
FIG. 4 is a schematic perspective of a flexible flat cable according to another preferred embodiment of the present invention.

Please refer to FIG. 4. A perspective view of a signal transmitting medium 40 according to another preferred embodiment of the present invention is shown. The signal transmitting medium 40 in the preferred embodiment is a flexible flat cable 40 including a ground wire 402, and an insulating layer 401 wrapping the ground wire 402. The ground wire 402 has a first end portion 4021 and a second end portion 4022 which are not wrapped by the insulating layer 401, and the two end portions 4021 and 4022 are electrically connected to the first circuit board 21 and the second circuit board 23 respectively as shown in FIG. 2. For a purpose of eliminating electrostatic charges accumulated in the flexible flat cable 40, a bare portion 403 of the ground wire 402 is provided. The bare portion 403 is located between the two end portions 4021 and 4022 of the flexible flat cable 40, and the insulating layer 401 wrapping the bare portion 403 of the ground wire 402 is stripped. The bare portion 403 of the ground wire 402 is bonded to a proper location of the casing 24 via a conductive adhesive material 4, and the electrostatic charges accumulated in the flexible flat cable 40 will be conducted via the bare portion 403 of the ground wire 402 to the casing 24 as a ground.

From the above description, by providing a signal transmitting apparatus using a flexible flat cable of the present invention in the slim-type optical disc drive, the electrostatic charges accumulated in the flexible flat cable will be conducted away, and the electrostatic discharge (ESD) and electromagnetic interference (EMI) can be effectively eliminated. The present invention is illustrated by referring to a slim-type optical disc drive used in a notebook computer. Nevertheless, the present invention can be applied to a compact disc ROM drive, an optical disc burner, a composite CD-ROM drive conventionally used in a desktop computer, or other electronic products having a signal transmitting apparatus.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A signal transmitting apparatus comprising:
   a conductor;
   a first and a second circuit boards, wherein the second circuit board is installed on the conductor; and
   a signal transmitting medium electrically interconnected between the first circuit board and the second circuit board and including a ground wire and an insulating layer wrapping the ground wire,
   wherein at least an end portion of the ground wire is not wrapped by the insulating layer and the end portion of the ground wire is separated into a first and a second conducting layers, wherein the first conducting layer is electrically connected to the second circuit board, and the second conducting layer is bent to overlap insulating layer and electrically connected to the conductor.

2. The signal transmitting apparatus according to claim 1 wherein the end portion of the ground wire is bonded to the conductor via a conductive adhesive material.

3. The signal transmitting apparatus according to claim 1 wherein the signal transmitting medium is a flexible flat cable.

4. The signal transmitting apparatus according to claim 1 wherein the conductor is taken as a ground.

5. An optical disc drive comprising:
   a casing;
   a first and a second circuit board, wherein the second circuit board is installed on the casing; and
   a flexible flat cable electrically interconnected between the first circuit board and the second circuit board and including a ground wire and an insulating layer wrapping the ground wire,
   wherein the ground wire has an end portion which is not wrapped by the insulating layer and the end portion of the ground wire is separated into a first and a second conducting layers, wherein the first conducting layer is electrically connected to the second circuit board, and the second conducting layer is bent to overlap the insulating layer and electrically connected to the casing.

6. The optical disc drive according to claim 5 wherein the casing is taken as a ground.

7. The optical disc drive according to claim 5 wherein the second conducting layer is bonded to the casing via a conductive adhesive material.

* * * * *